US009786816B2

(12) United States Patent
Lee et al.

(10) Patent No.: US 9,786,816 B2
(45) Date of Patent: Oct. 10, 2017

(54) LIGHT EMITTING DEVICE, LIGHT EMITTING DEVICE PACKAGE, AND LIGHTING APPARATUS INCLUDING THE PACKAGE (71) Applicant: LG INNOTEK CO., LTD., Seoul (KR)

(72) Inventors: Sang Youl Lee, Seoul (KR); Jae Won Seo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/879,798

(22) Filed: Oct. 9, 2015

(65) Prior Publication Data

US 2016/0111601 A1 Apr. 21, 2016

(30) Foreign Application Priority Data

Oct. 17, 2014 (KR) ........................ 10-2014-0140872

(51) Int. Cl.
 *H01L 29/227* (2006.01)
 *H01L 33/38* (2010.01)
 (Continued)

(52) U.S. Cl.
 CPC .......... *H01L 33/382* (2013.01); *H01L 33/387* (2013.01); *H01L 33/405* (2013.01);
 (Continued)

(58) Field of Classification Search
 CPC ... H01L 33/382; H01L 33/387; H01L 33/405; H01L 33/46
 (Continued)

(56) References Cited

U.S. PATENT DOCUMENTS

2005/0087884 A1 4/2005 Stokes et al.
2007/0145398 A1* 6/2007 Shin ...................... H01L 33/483
   257/98
(Continued)

FOREIGN PATENT DOCUMENTS

DE  10 2008 032 318 A1  10/2009
EP  2 423 984 A2  2/2012
(Continued)

*Primary Examiner* — Matthew E Warren
(74) *Attorney, Agent, or Firm* — Birch, Stewart, Kolasch & Birch, LLP (57) ABSTRACT

Embodiments provide a light emitting device including a substrate, a light emitting structure including a first conductive semiconductor layer, an active layer, and a second conductive semiconductor layer, disposed under the substrate, a reflective layer disposed under the second conductive semiconductor layer, the reflective layer having at least one first through-hole formed in a first direction, the first direction being a thickness direction of the light emitting structure, a contact layer embedded in at least one second through-hole penetrating the reflective layer, the second conductive semiconductor layer, and the active layer so as to be connected to the first conductive semiconductor layer, and an insulation layer disposed between the contact layer and each of the reflective layer, the second conductive semiconductor layer, and the active layer, the insulation layer being embedded in the first through-hole.

12 Claims, 8 Drawing Sheets (51) Int. Cl.
*H01L 33/40* (2010.01)
*H01L 33/46* (2010.01)
*H01L 33/54* (2010.01)
*H01L 33/62* (2010.01)
*H01L 33/42* (2010.01)
*H01L 33/48* (2010.01)

(52) U.S. Cl.
CPC .............. *H01L 33/46* (2013.01); *H01L 33/54* (2013.01); *H01L 33/62* (2013.01); *H01L 33/38* (2013.01); *H01L 33/42* (2013.01); *H01L 33/486* (2013.01)

(58) Field of Classification Search
USPC .................................................. 257/98–100
See application file for complete search history.

(56) References Cited

U.S. PATENT DOCUMENTS

| | | | | |
|---|---|---|---|---|
| 2008/0206516 | A1* | 8/2008 | Matsushima | H05K 1/0212 428/131 |
| 2011/0156064 | A1* | 6/2011 | Seo | H01L 25/0753 257/88 |
| 2011/0227109 | A1* | 9/2011 | Kim | H01L 33/20 257/98 |
| 2013/0113006 | A1 | 5/2013 | Kim et al. | |
| 2014/0175489 | A1 | 6/2014 | Hodota | |
| 2015/0144984 | A1* | 5/2015 | Chen | H01L 33/08 257/99 |
| 2015/0349232 | A1* | 12/2015 | Lee | H01L 33/647 257/91 |

FOREIGN PATENT DOCUMENTS

| | | |
|---|---|---|
| EP | 2 755 245 A2 | 7/2014 |
| JP | 2006-245058 A | 9/2006 |
| JP | 2012-114130 A | 6/2012 |
| JP | 2013-232541 A | 11/2013 |

* cited by examiner

LIGHT EMITTING DEVICE, LIGHT EMITTING DEVICE PACKAGE, AND LIGHTING APPARATUS INCLUDING THE PACKAGE

CROSS REFERENCE TO RELATED APPLICATION

This application claims priority under 35 U.S.C. §119 to Korean Patent Application No. 10-2014-0140872, filed in Korea on 17 Oct. 2014, which is hereby incorporated in its entirety by reference as if fully set forth herein.

TECHNICAL FIELD

Embodiments relate to a light emitting device, a light emitting device package, and a lighting apparatus including the package.

BACKGROUND

Light Emitting Diodes (LEDs) are semiconductor devices that convert electricity into light using characteristics of compound semiconductors so as to enable transmission/reception of signals, or that are used as a light source.

Group III-V nitride semiconductors are in the spotlight as core materials of light emitting devices such as, for example, LEDs or Laser Diodes (LDs) due to physical and chemical characteristics thereof.

The LEDs do not include environmentally harmful materials such as mercury (Hg) that are used in conventional lighting appliances such as, for example, fluorescent lamps and incandescent bulbs, and thus are very eco-friendly, and have several advantages such as, for example, long lifespan and low power consumption. As such, conventional light sources are being rapidly replaced with LEDs.

Meanwhile, a conventional flip-chip type light emitting device may include a reflective layer which reflects light in order to allow light, emitted from an active layer, to escape from the light emitting device. At this time, the reflective layer formed of a reflective material such as silver (Ag) has low adhesive force with other layers, thus being easily peeled off, which may deteriorate the reliability of the light emitting device.

SUMMARY

Embodiments provide a light emitting device having improved reliability, a light emitting device package, and a lighting apparatus including the package.

In one embodiment, a light emitting device includes a substrate, a light emitting structure disposed under the substrate, the light emitting structure including a first conductive semiconductor layer, an active layer, and a second conductive semiconductor layer, a reflective layer disposed under the second conductive semiconductor layer, the reflective layer having at least one first through-hole formed in a first direction, the first direction being a thickness direction of the light emitting structure, a contact layer embedded in at least one second through-hole penetrating the reflective layer, the second conductive semiconductor layer, and the active layer so as to be connected to the first conductive semiconductor layer, and an insulation layer disposed between the contact layer and each of the reflective layer, the second conductive semiconductor layer, and the active layer, the insulation layer being embedded in the first through-hole.

For example, the first through-hole may expose the second conductive semiconductor layer, and the insulation layer may comprise an insulation material having greater adhesion to the second conductive semiconductor layer than adhesion of the reflective layer to the second conductive semiconductor layer.

For example, the first through-hole may have a first width in a second direction, the second direction being different from the first direction, and the first width may be less than a second width of the second through-hole in the second direction.

For example, the at least one first through-hole may include a plurality of first through-holes, and the sum of first widths of the respective first through-holes in a second direction may be 30% or less of the total width of the reflective layer in the second direction, the second direction being different from the first direction.

For example, the insulation layer may include a distributed bragg reflector or omni-directional reflector layer.

For example, the first through-hole may have a first width in a second direction, the second direction being different from the first direction, and the first width may be within a range from 5 μm to 30 μm.

For example, the light emitting device may further include a transmissive conductive layer disposed between the second conductive semiconductor layer and the reflective layer, and the first through-hole may expose the transmissive conductive layer, and the insulation layer may include an insulation material having greater adhesion to the transmissive conductive layer than adhesion of the reflective layer to the transmissive conductive layer.

For example, the light emitting device may further include a first pad disposed under the contact layer, the first pad being connected to the first conductive semiconductor layer via the contact layer, and a second pad penetrating the insulation layer so as to be connected to the reflective layer.

For example, the insulation layer may extend in a second direction so as to be disposed between each of the first and second pads and the contact layer, the second direction being different from the first direction.

For example, the first through-hole may be located above at least one of the first pad or the second pad.

For example, the at least one first through-hole may include a plurality of first through-holes, and the respective first through-holes may have different first widths in a second direction, the second direction being different from the first direction.

For example, the at least one first through-hole may include a plurality of first through-holes, and the respective first through-holes may have the same first width in a second direction, the second direction being different from the first direction.

For example, the at least one second through-hole may include a plurality of second through-holes, and the number of the at least one first through-hole, located between first ones of the second through-holes, may be different from or be the same as the number of the at least one first through-hole located between second ones of the second through-holes.

For example, the second through-holes may include a plurality of second-first through-holes located closer to an edge than to a center of the light emitting structure, and a plurality of second-second through-holes located closer to the center than to the edge of the light emitting structure, and the number of the at least one first through-hole may be greater between the second-first through-holes than that between the second-second through-holes.

For example, the at least one first through-hole may include a plurality of first through-holes spaced apart from one another by the same distance or different distances.

For example, the first through-holes may have first widths in a second direction, the second direction being different from the first direction, and the first widths increasing with decreasing distance to an edge of the reflective layer.

In another embodiment, a light emitting device package includes the light emitting device, a first solder electrically connected to the first conductive semiconductor layer of the light emitting device, a second solder electrically connected to the second conductive semiconductor layer of the light emitting device, first and second lead frames spaced apart from each other in a second direction, the second direction being different from the first direction, and a molding member configured to enclose and protect the light emitting device.

In a further embodiment, a lighting apparatus includes the light emitting device package.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, exemplary embodiments will be described in detail with reference to the accompanying drawings to aid in understanding of the embodiments. However, the embodiments may be altered in various ways, and the scope of the embodiments should not be construed as limited to the following description. The embodiments are intended to provide those skilled in the art with more complete explanation.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

In addition, the relative terms "first", "second", "top/upper/above", "bottom/lower/under" and the like in the description and in the claims may be used to distinguish between any one substance or element and other substances or elements and not necessarily for describing any physical or logical relationship between the substances or elements or a particular order.

In the drawings, the thickness or size of each layer may be exaggerated, omitted or schematically illustrated for clarity and convenience. In addition, the size of each constituent element does not wholly reflect an actual size thereof.

Figure 1:
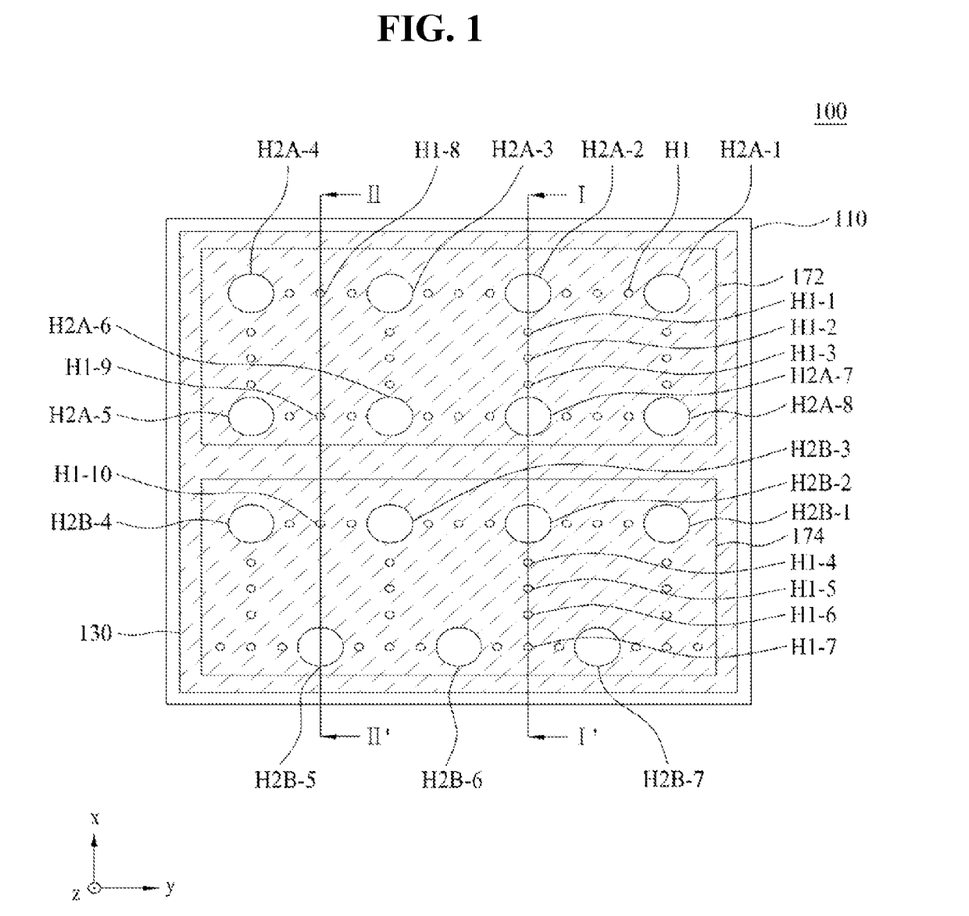
FIG. 1 is a plan view of a light emitting device according to an embodiment.
Figure 2:
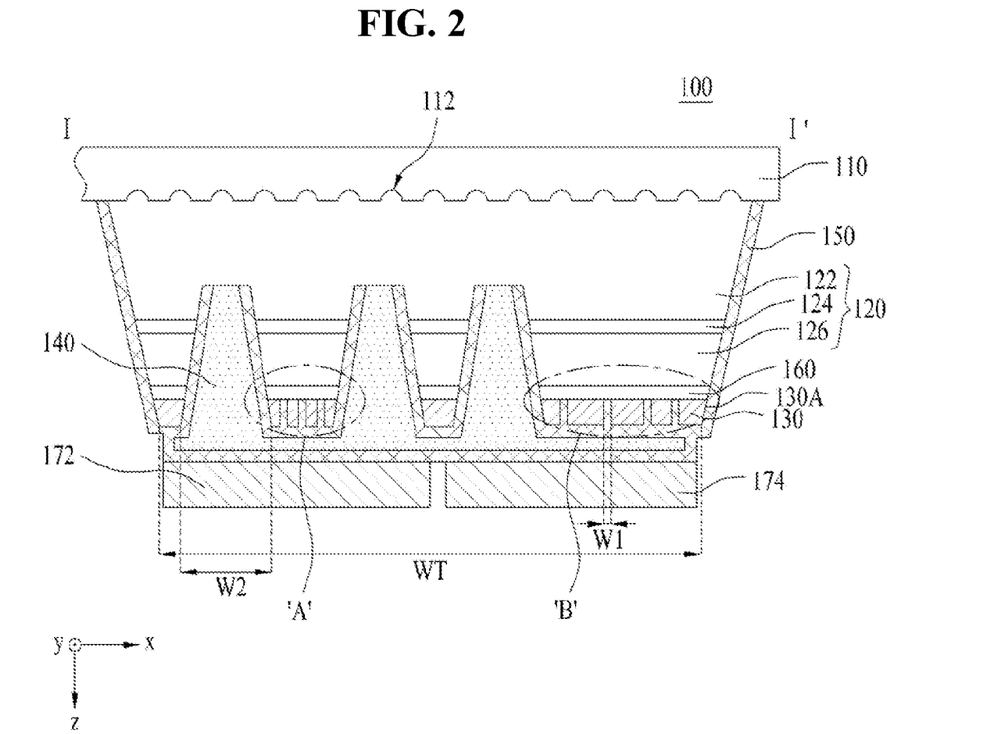
FIG. 2 is a sectional view taken along line I-I' illustrated in FIG. 1.
Figure 3:
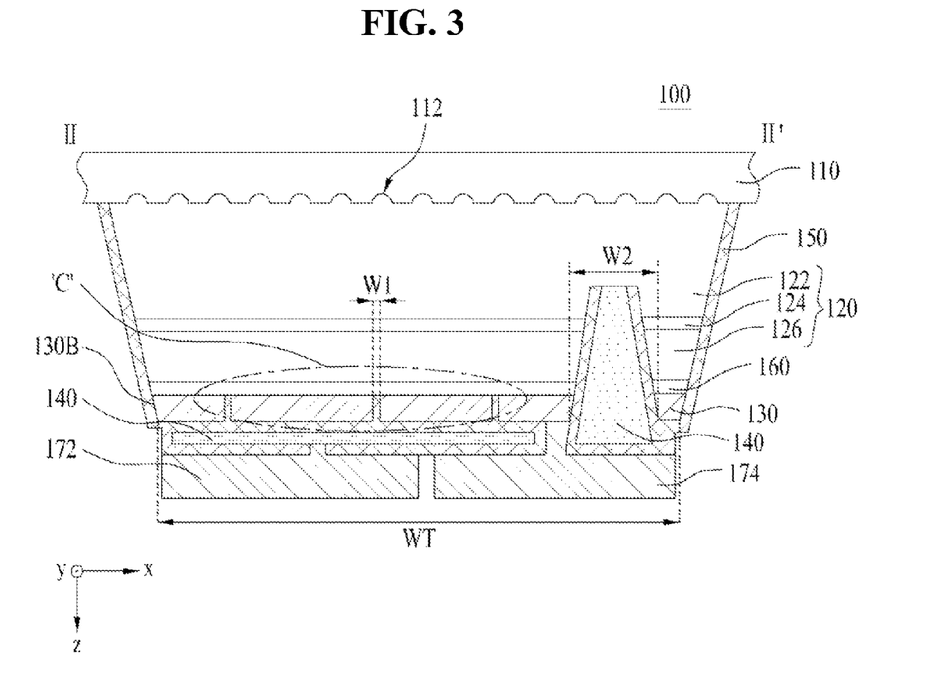
FIG. 3 is a sectional view taken along line II-II' illustrated in FIG. 1.
Figure 4:
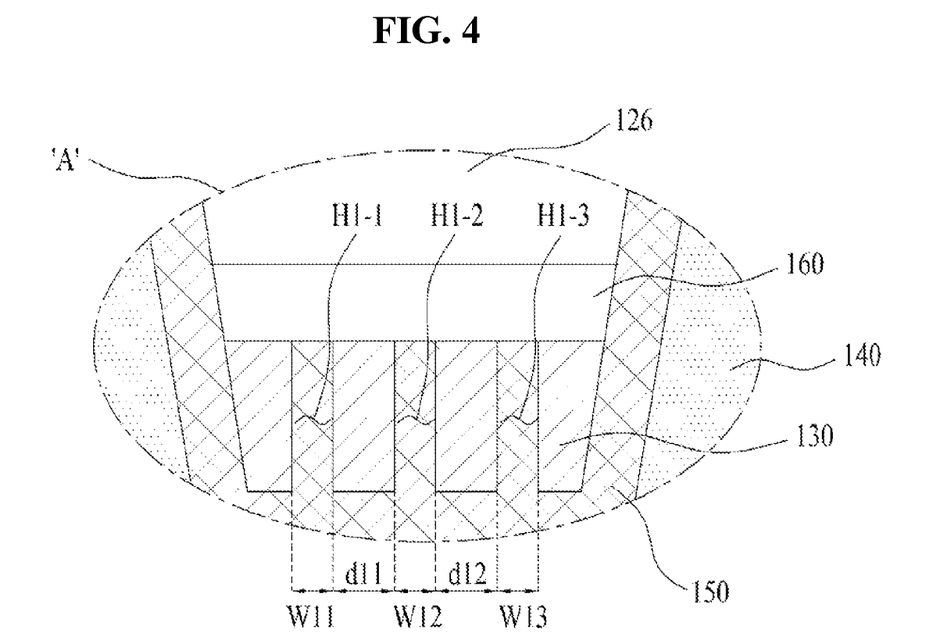
FIG. 4 is an enlarged sectional view of portion 'A' illustrated in FIG. 2.
Figure 5:
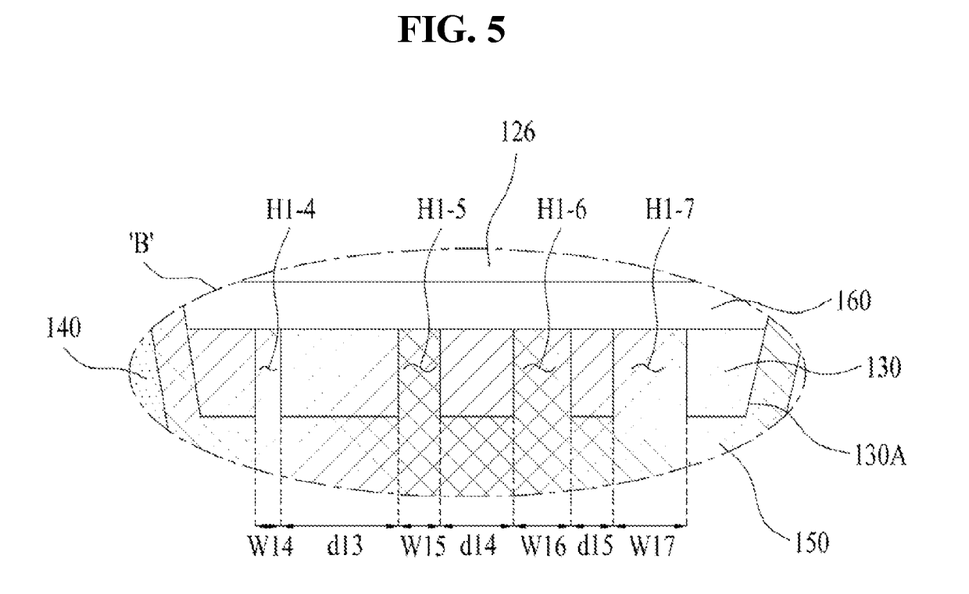
FIG. 5 is an enlarged sectional view of portion 'B' illustrated in FIG. 2.
Figure 6:
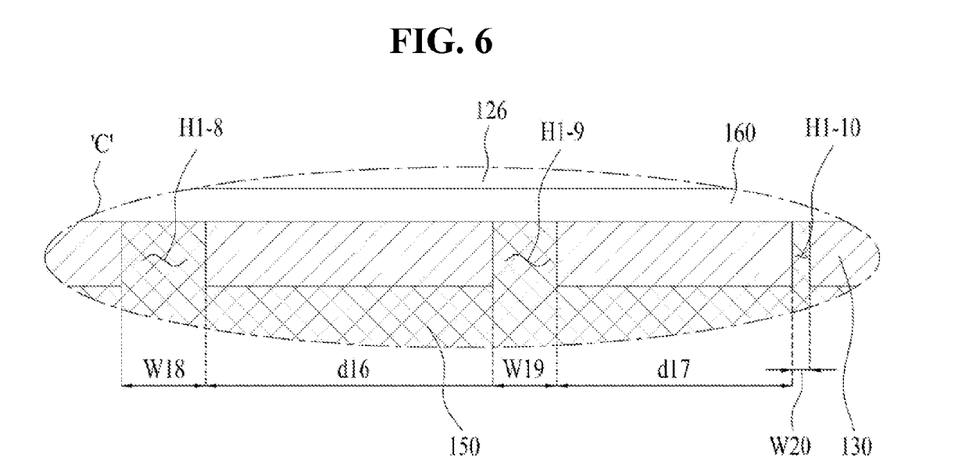
FIG. 6 is an enlarged sectional view of portion 'C' illustrated in FIG. 3.

FIG. 1 is a plan view of a light emitting device 100 according to an embodiment, FIG. 2 is a sectional view taken along line I-I' illustrated in FIG. 1, FIG. 3 is a sectional view taken along line II-II' illustrated in FIG. 1, FIG. 4 is an enlarged sectional view of portion 'A' illustrated in FIG. 2, FIG. 5 is an enlarged sectional view of portion 'B' illustrated in FIG. 2, and FIG. 6 is an enlarged sectional view of portion 'C' illustrated in FIG. 3.

The light emitting device 100 according to the embodiment will be described below with reference to FIGS. 1 to 6. FIG. 1 is a plan view illustrating the light emitting device 100 of FIG. 2 viewed in the +z-axis. For convenience of description, an insulation layer 150 and a contact layer 140 of the light emitting device 100 illustrated in FIGS. 2 to 6 are not illustrated in FIG. 1.

The light emitting device 100 may include a substrate 110, a light emitting structure 120, a reflective layer 130, a contact layer 140, an insulation layer 150, a transmissive conductive layer (or a transparent electrode) 160, and first and second pads 172 and 174.

The light emitting structure 120 may be displaced under the substrate 110. The substrate 110 may comprise a conductive material or non-conductive material. For example, the substrate 110 may comprise at least one of sapphire ($Al_2O_3$), GaN, SiC, ZnO, GaP, InP, $Ga_2O_3$, GaAs, or Si, although the embodiment is not limited to the material of the substrate 110.

In order to improve the difference in the Coefficient of Thermal Expansion (CTE) and the lattice mismatch between the substrate 110 and the light emitting structure 120, a buffer layer (or a transition layer)(not illustrated) may be further disposed between the two 110 and 120. The buffer layer, for example, may comprise at least one material selected from the group consisting of Al, In, N, and Ga, without being limited thereto. In addition, the buffer layer may have a single layer or multi-layer structure.

In addition, the substrate 110 illustrated in FIG. 1 may include a pattern 112. Here, the pattern 112 may have any of various cross-sectional shapes in order to assist light, emitted from an active layer 124, in escaping from the light emitting device 100. For example, the substrate 110 may be a Patterned Sapphire Substrate (PSS).

The light emitting structure 120 may include a first conductive semiconductor layer 122, the active layer 124, and a second conductive semiconductor layer 126, which are arranged in sequence under the substrate 110.

The first conductive semiconductor layer 122 may be disposed under the substrate 110, and may be implemented in, for example, group III-V or II-VI compound semiconductors doped with a first conductive dopant. When the first conductive semiconductor layer 122 is an n-type semiconductor layer, the first conductive dopant may be an n-type dopant, and comprise Si, Ge, Sn, Se, or Te, without being limited thereto.

For example, the first conductive semiconductor layer 122 may comprise a semiconductor material having a composition of $Al_xIn_yGa_{(1-x-y)}N$ ($0 \leq x \leq 1$, $0 \leq y \leq 1$, $0 \leq x+y \leq 1$). The first conductive semiconductor layer 122 may comprise any one or more materials selected from among GaN, InN, AlN, InGaN, AlGaN, InAlGaN, AlInN, AlGaAs, InGaAs, AlInGaAs, GaP, AlGaP, InGaP, AlInGaP, and InP.

The active layer 124 is disposed between the first conductive semiconductor layer 122 and the second conductive semiconductor layer 126. The active layer 124 is a layer in which electrons (or holes) injected through the first conductive semiconductor layer 122 and holes (or electrons) injected through the second conductive semiconductor layer 126 meet each other to emit light having energy determined by an inherent energy band of a constituent material of the active layer 124. The active layer 124 may be formed into at least one structure selected from among a single-well structure, a multi-well structure, a single-quantum well structure, a multi-quantum well structure, a quantum dot structure, and a quantum wire structure.

The active layer 124 may include a well layer and a barrier layer having a pair structure of any one or more of InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may be formed above and/or under the active layer 124. The conductive clad layer may be formed of semiconductors having higher band gap energy than the band gap energy of the barrier layer of the active layer 124. For example, the conductive clad layer may include GaN, AlGaN, InAlGaN, or an ultra lattice structure. In addition, the conductive clad layer may be doped with an n-type or p-type dopant.

In some embodiments, the active layer 124 may emit ultraviolet light having a specific wavelength band. Here, the ultraviolet light wavelength band may be within a range from 100 nm to 400 nm. In particular, the active layer 124 may emit light having a wavelength band within a range from 100 nm to 280 nm. However, the embodiment is not limited to the wavelength band of light emitted from the active layer 124.

The second conductive semiconductor layer 126 may be disposed under the active layer 124 and may be formed of a semiconductor compound. The second conductive semiconductor layer 126 may be formed of, for example, group III-V or II-VI compound semiconductors. For example, the second conductive semiconductor layer 126 may comprise a semiconductor material having a composition of $In_xAl_yGa_{1-x-y}N$ ($0 \leq x \leq 1$, $0 \leq y \leq 1$, $0 \leq x+y \leq 1$). The second conductive semiconductor layer 126 may be doped with a second conductive dopant. When the second conductive semiconductor layer 126 is a p-type semiconductor layer, the second conductive dopant may be a p-type dopant and may include, for example, Mg, Zn, Ca, Sr, or Ba.

The first conductive semiconductor layer 122 may be an n-type semiconductor layer, and the second conductive semiconductor layer 126 may be a p-type semiconductor layer. Alternatively, the first conductive semiconductor layer 122 may be a p-type semiconductor layer, and the second conductive semiconductor layer 126 may be an n-type semiconductor layer.

The light emitting structure 120 may be implemented in any one structure selected from among an n-p junction structure, a p-n junction structure, an n-p-n junction structure, and a p-n-p junction structure.

Since the light emitting device 100 illustrated in FIGS. 1 to 6 has a flip chip bonding structure, and therefore light emitted from the active layer 124 may be emitted through the first conductive semiconductor layer 122 and the substrate 110. To this end, the first conductive semiconductor layer 122 and the substrate 110 may be formed of a light transmissive material. At this time, although the second conductive semiconductor layer 126 may be formed of a transmissive or non-transmissive material, or a reflective material, the embodiment may not be limited to a specific material.

The reflective layer 130 may be disposed under the second conductive semiconductor layer 126, and may have at least one first through-hole H1 (e.g., H1-1 to H1-10) formed in a first direction (e.g., in the z-axis) that is the thickness direction of the light emitting structure 120. The reflective layer 130 serves to reflect light that is emitted from the active layer 124 and directed to the first and second pads 172 and 174.

To this end, the reflective layer 130 may be formed of a reflective material such as silver (Ag).

In addition, the at least one first through-hole H1 (e.g., H1-1 to H1-10) may be located above at least one of the first or second pads 172 and 174. For example, referring to FIGS. 1, 2, and 4, the first through-holes H1-1, H1-2, and H1-3 may be located above the first pad 172. Referring to FIGS. 1, 2, and 5, the first through-holes H1-4, H1-5, H1-6, and Hi-7 may be located above the second pad 174.

In addition, although a plurality of first through-holes H1 may be provided, the embodiment is not limited as to the number of the first through-holes H1.

The respective first through-holes H1 (e.g., H1-1 to H1-10) may have first widths W1 in a second direction (e.g., in the x-axis), which may differ from one another, or may be the same. Here, although the second direction may be perpendicular to the first direction, the embodiment is not limited thereto.

For example, as exemplarily illustrated in FIG. 4, the first through-holes H1-1, H1-2, and H1-3 may have first widths W11, W12, and W13, respectively, which may be the same.

Alternatively, as exemplarily illustrated in FIG. 5, the first through-holes H1-4, H1-5, H1-6, and H1-7 may have first widths W14, W15, W16, and W17, respectively, which may differ from one another. In addition, as exemplarily illustrated in FIG. 6, the first through-holes H1-8, H1-9, and H1-10 may have first widths W18, W19, and W20, respectively, which may differ from one another.

In addition, the first through-holes H1 may be spaced apart from one another by a constant distance, or by different distances.

For example, as exemplarily illustrated in FIG. 4, the first through-holes H1-1, H1-2, and H1-3 may be spaced apart from one another by the same distance (or gap) d11 and d12.

Alternatively, as exemplarily illustrated in FIG. 5, the first through-holes H1-4, H1-5, H1-6, and H1-7 may be spaced apart from one another by different distances d13, d14, and d15. As exemplarily illustrated in FIG. 6, the first through-holes H1-8, H1-9, and H1-10 may be spaced apart from one another by different distances d16 and d17.

In addition, although a plurality of second through-holes H2 may be provided, the embodiment is not limited thereto. The at least one first through-hole H1 may be located between the second through-holes H2.

In addition, the number of the at least one first through-holes H1, which are located between first ones of the second through-holes H2, may be different from or the same as the number of the at least one first through-holes H1 which are located between second ones of the second through-holes H2.

As exemplarily illustrated in FIG. 1, the same number of the first through-holes H1, for example, three first through-holes H1 may be located between the respective second through-holes H2A-1 to H2A-8 and H2B-1 to H2B-7. For example, referring to FIG. 1, the number of the first through-holes H1-1, H1-2, and H1-3, located between first ones of the second through-holes H2, i.e. between the second through-holes H2A-2 and H2A-7 may be 3, and the number of the first through-holes located between second ones of the second through-holes H2, i.e. between the second through-holes H2A-2 and H2A-3 may be 3, which is the same as the number of the first through-holes H1-1, H1-2, and H1-3. As such, the number of the first through-holes H1 located between the second through-holes H2A-1 to H2A-8 and H2B-1 to H2B-7 is the same.

However, although the number of the first through-holes H1-1, H1-2, and H1-3, located between the second through-holes H2A-2 and H2A-7 corresponding to first ones of the second through-holes H2 is 3 as illustrated in FIG. 1, the number of the first through-holes H1 located between the second through-holes H2A-2 and H2A-3 corresponding to second ones of the second through-holes H2 may be less than or greater than 3 unlike the illustration of FIG. 1.

The contact layer 140 may be embedded in the at least one second through-hole H2 (e.g., H2A-1 to H2A-8 and H2B-1 to H2B-7), which penetrate the reflective layer 130, the second conductive semiconductor layer 126, and the active layer 124, so as to be electrically connected to the first conductive semiconductor layer 122. As such, the contact layer 140 may be electrically connected to the first conductive semiconductor layer 122 via point contact.

Although the contact layer 140 may be implemented in the form of a penetration electrode, the embodiment is not limited thereto. That is, in another embodiment, although not illustrated, the contact layer 140 may bypass the reflective layer 130, the second conductive semiconductor layer 126, and the active layer 124 to thereby be electrically connected to the first conductive semiconductor layer 122. As such, the contact layer 140 may serve as a first electrode.

The contact layer 140 may comprise an ohmic contact material, and serve as an ohmic layer. Thus, a separate ohmic layer (not illustrated) may be unnecessary, or a separate ohmic layer may be disposed above or under the contact layer 140.

The contact layer 140 may reflect or transmit light emitted from the active layer 124, rather than absorbing the light, and may be formed of any material that is capable of growing in good quality on the insulation layer 150. For example, the contact layer 140 may be formed of a metal, and may be formed of Ag, Ni, Al, Rh, Pd, Ir, Ru, Mg, Zn, Pt, Au, Hf, and selective combinations thereof.

In addition, the first width W1 of the at least one first through-hole H1 (e.g., H1-1 to H1-10) in the second direction (e.g., in the x-axis), which is different from the first direction (e.g., in the z-axis), may be less than the second width W2 of the at least one second through-hole H2 (e.g., H2A-1 to H2A-8 and H2B-1 to H2B-7).

In addition, the transmissive conductive layer 160 may be disposed between the second conductive semiconductor layer 126 and the reflective layer 130. The transmissive conductive layer 160 may be a Transparent Conductive Oxide (TCO) film. For example, the transmissive conductive layer 160 may comprise at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni/IrOx/Au, and Ni/IrOx/Au/ITO, and is not limited to these materials.

The reflective layer 130 and the transmissive conductive layer 160 may serve as a second electrode, and in some cases, the transmissive conductive layer 160 may be omitted.

The insulation layer 150 is disposed between the reflective layer 130 and the contact layer 140, between the second conductive semiconductor layer 126 and the contact layer 140, and between the active layer 124 and the contact layer 140. Thus, each of the reflective layer 130, the second conductive semiconductor layer 126, and the active layer 124 may be electrically insulated from the contact layer 140 by the insulation layer 150. In addition, when the transmissive conductive layer 160 is not omitted, the insulation layer 150 may be disposed between the transmissive conductive layer 160 and the contact layer 140 so as to electrically separate the two 160 and 140 from each other.

In addition, the insulation layer 150 may be embedded in the first through-hole H1 (e.g., H1-1 to H1-10) formed in the reflective layer 130.

The insulation layer 150 may extend in the second direction (e.g., in the x-axis), which is different from the first direction (e.g., in the z-axis), so as to be disposed between each of the first and second pads 172 and 174 and the contact layer 140.

When the transmissive conductive layer 160 is omitted, the insulation layer 150 may be embedded in the first through-hole H1 (e.g., H1-1 to H1-8) so as to be directly adhered to the second conductive semiconductor layer 126. In this case, the insulation layer 150 may be formed of a material having stronger adhesion than adhesion between the reflective layer 130 and the second conductive semiconductor layer 126. As such, since the adhesion between the insulation layer 150 and the second conductive semiconductor layer 126 is stronger than the adhesion between the reflective layer 130 and the second conductive semiconductor layer 126, weak adhesion between the reflective layer 130 and the second conductive semiconductor layer 126 may be strengthened by the insulation layer 150 embedded in the first through-hole H1 (e.g., H1-1 to H1-8).

Alternatively, when the transmissive conductive layer 160 is not omitted, the insulation layer 150 may be embedded in the first through-hole H1 (e.g., H1-1 to H1-8) so as to be directly adhered to the transmissive conductive layer 160. In this case, the insulation layer 150 may be formed of a material having stronger adhesion than adhesion between the reflective layer 130 and the transmissive conductive layer 160. As such, weak adhesion between the reflective layer 130 and the transmissive conductive layer 160 may be strengthened by strong adhesion between the transmissive conductive layer 160 and the insulation layer 150 embedded in the first through-hole H1 (e.g., H1-1 to H1-8).

As described above, the insulation layer 150 may be formed of a material which is capable of increasing adhesion between the reflective layer 130 and the insulation layer 150 beyond adhesion between the second conductive semiconductor layer 126 (or the transmissive conductive layer 160) and the reflective layer 130.

The insulation layer 150 may be formed in a multi-layer structure of multiple layers or at least two layers, and may comprise at least one of $SiO_2$, $TiO_2$, $ZrO_2$, $Si_3N_4$, $Al_2O_3$, or $MgF_2$.

In addition, the insulation layer 150 may include a Distributed Bragg Reflector (DBR) or Omni-Directional Reflector (ODR). When the insulation layer 150 includes the DBR or ODR, the insulation layer 150 may perform both an insulation function and a reflection function.

The DBR may be configured in a manner such that a first layer (not illustrated) and a second layer (not illustrated), which have different indices of refraction, are alternately stacked one above another at least once. The DBR may be an electrical insulation material. For example, the first layer may include a first dielectric layer such as $TiO_2$, and the second layer may include a second dielectric layer such as $SiO_2$. For example, the DBR may take the form of a stack of at least one pair of $TiO_2/SiO_2$ layers. Each of the first layer and the second layer may have a thickness of $\lambda/4$, and $\lambda$ may be the wavelength of light generated in a light emitting cell.

The ODR may be configured in such a manner that a low refractive index layer is formed on a metal reflective layer (not illustrated). The metal reflective layer may be formed of Ag or Al, and the low refractive index layer may be formed of a transparent material such as $SiO_2$, $Si_3N_4$, or MgO. Alternatively, the ODR may take the form of a stack of pairs of a $SiO_2$ layer and a $TiO_2$ layer repeatedly stacked one above another, although the embodiment is not limited thereto.

Meanwhile, the first pad 172 may be disposed under the contact layer 140 so as to be electrically connected to the first conductive semiconductor layer 122 via the contact layer 140. That is, since the first pad 172 may be electrically connected to the contact layer 140 as illustrated in FIG. 3 and the contact layer 140 may be electrically connected to the first conductive semiconductor layer 122 as illustrated in FIG. 2, it will be appreciated that the first pad 172 is electrically connected to the first conductive semiconductor layer 122 via the contact layer 140.

In addition, referring to FIG. 3, it will be appreciated that the second pad 174 penetrates the insulation layer 150 so as to be electrically connected to the second conductive semiconductor layer 126 via the reflective layer 130. Each of the first and second pads 172 and 174 may comprise an electrode material.

Hereinafter, the light emitting device according to the embodiment described above and a light emitting device according to a comparative embodiment in which the reflective layer 130 includes no first through-hole H1 will be described with reference to the accompanying drawings.

Figure 7:
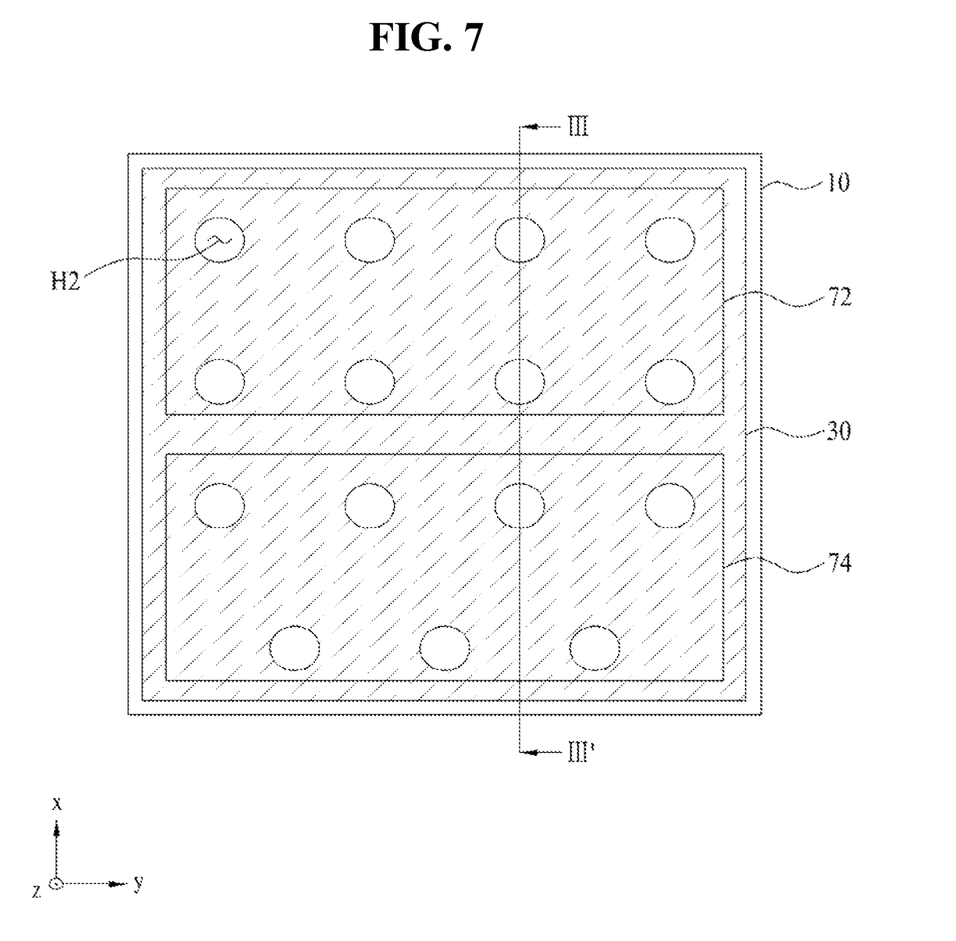
FIG. 7 is a plan view of a light emitting device according to a comparative embodiment.
Figure 8:
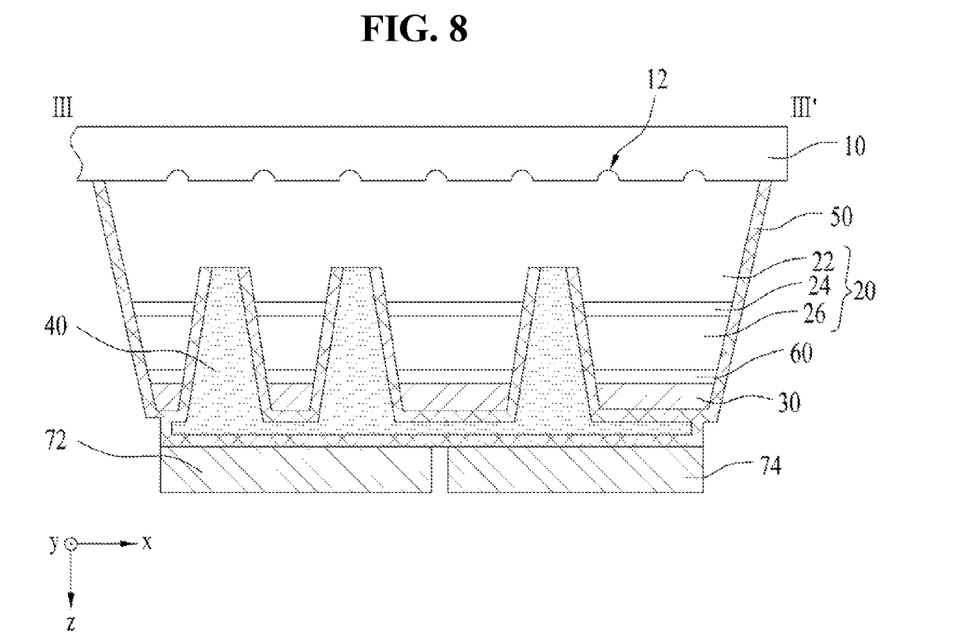
FIG. 8 is a sectional view taken along line III-III' illustrated in FIG. 7.

FIG. 7 is a plan view of a light emitting device according to a comparative embodiment, and FIG. 8 is a sectional view taken along line illustrated in FIG. 7.

The light emitting device according to the comparative embodiment illustrated in FIGS. 7 and 8 includes a substrate 10, a light emitting structure 20, a reflective layer 30, a contact layer 40, an insulation layer 50, a transmissive electrode layer 60, and first and second pads 72 and 74.

The reflective layer 130 of the light emitting device 100 illustrated in FIGS. 1 to 6 has the first through-hole H1, and the insulation layer 150 is embedded in the first through-hole H1. On the other hand, in the light emitting device illustrated in FIGS. 7 and 8, the reflective layer 30 has no first through-hole. As such, the light emitting device according to the comparative embodiment illustrated in FIGS. 7 and 8 is approximately the same as the light emitting device 100 illustrated in FIGS. 1 and 2 except that the configurations of the reflective layer 30 and the insulation layer 50 differ from the configurations of the reflective layer 130 and the insulation layer 150 illustrated in FIG. 1. That is, the substrate 10, the light emitting structure 20, the contact layer 40, the transmissive electrode layer 60, and the first and second pads 72 and 74 respectively correspond to the substrate 110, the light emitting structure 120, the contact layer 140, the transmissive conductive layer 160, and the first and second pads 172 and 174 illustrated in FIGS. 1 and 2, and thus perform the same functions and have the same configurations. In addition, a first conductive semiconductor layer 22, an active layer 24, and a second conductive semiconductor layer 26 illustrated in FIG. 8 respectively correspond to the first conductive semiconductor layer 122, the active layer 124, and the second conductive semiconductor layer 126 illustrated in FIG. 2, and thus perform the same functions and have the same configurations.

The light emitting device according to the comparative embodiment illustrated in FIGS. 7 and 8 have no first through-hole H1 of the light emitting device 100 according to the embodiment illustrated in FIGS. 1 to 6. That is, the light emitting device according to the comparative embodiment has only the second through-hole H2 illustrated in FIGS. 1 to 6.

When the reflective layer 30 is formed of a metal material having high reflectance such as silver (Ag), the reflective layer 30 may peel off from the transmissive electrode layer 60 because of weak adhesion between the reflective layer 30 and the transmissive electrode layer 60. This is because silver (Ag) has excellent reflectance, but has poor adhesion.

In addition, when the light emitting device according to the comparative embodiment illustrated in FIGS. 7 and 8 is flip-chip bonded to a package body which will be described below, peeling of a metal (e.g., silver (Ag)) may occur at the interface between the transmissive electrode layer 60 and the reflective layer 30 due to the difference between thermal expansion coefficients thereof.

However, in the case of the light emitting device 100 according to the embodiment in which the first through-hole H1 is formed in the reflective layer 130, the insulation layer 150, which has higher adhesion with respect to the transmissive conductive layer 160 (or the second conductive semiconductor layer 126 when the transmissive conductive layer 160 is omitted) than a metal material such as silver (Ag), is embedded in the first through-hole H1. Thus, weak adhesion between the reflective layer 130 and the transmissive conductive layer 160 (or the second conductive semiconductor layer 126 when the transmissive conductive layer 160 is omitted) may be strengthened by the insulation layer 150 embedded in the first through-hole H1, and the metal peeling phenomenon described above may be prevented.

In addition, the first widths W1 of the first through-holes H1 in the second direction (e.g., in the x-axis) which is different from the first direction (e.g., in the z-axis) may increase with decreasing distance to the edge of the reflective layer 130. In addition, the first widths W1 of the first through-holes H1 in the second direction (e.g., in the x-axis) which is different from the first direction (e.g., in the z-axis) may increase with decreasing distance to the edge of the light emitting structure 120.

For example, referring to FIGS. 2 and 5, it will be appreciated that the first widths W17, W16, W15, and W14 of the first through-holes H1-7, H1-6, H1-5, and H1-4 increase with decreasing distance to an edge 130A of the reflective layer 130. This may be represented by W17>W16>W15>W14. Likewise, referring to FIGS. 3 and 6, it will be appreciated that the first widths W18, W19, and W20 of the first through-holes H1-8, H1-9, and H1-10 increase with decreasing distance to an edge 130B of the reflective layer 130. This may be represented by W18>W19>W20.

When the first widths W1 of the first through-holes H1 increase with decreasing distance to the edges 130A and 130B of the reflective layer 130, the contact area between the insulation layer 150 and the transmissive conductive layer 160 (or the second conductive semiconductor layer 126 when the transmissive conductive layer 160 is omitted) increases. As such, the coupling force between the insulation layer 150 and the transmissive conductive layer 160 (or the second conductive semiconductor layer 126 when the transmissive conductive layer 160 is omitted) may be greater at the edges 130A and 130B than that at the center of the reflective layer 130. Hence, even if the edge of the reflective layer 130 has lower adhesion and suffers from more frequent metal peeling than the center of the reflective layer 130, it is possible to strengthen the low adhesion at the edge and thus prevent the metal peeling phenomenon.

In addition, the second through-holes H2 may be divided into a plurality of second-first through-holes and second-second through-holes. The second-first through-holes may be defined as those second through-holes that are located closer to the edge than to the center of the light emitting structure 120. In addition, the second-second through-holes may be defined as those through-holes that are located closer to the center than to the edge of the light emitting structure 120. Referring to FIG. 1, for example, the second-first through-holes H2A-1, H2A-2, H2A-3, H2A-4, H2A-5, H2A-8, H2B-1, H2B-4, H2B-5, H2B-6, and H2B-7 are located closer to the edge than to the center of the light emitting structure 120 as compared to the second-second through-holes H2A-6, H2A-7, H2B-2, and H2B-3.

According to the embodiment, the number of the first through-holes H1, located between the second-first through-holes, may be greater than the number of the first through-holes H1 located between the second-second through-holes.

In the case of FIG. 1, the number of the first through-holes, located between the second-first through-holes H2A-1, H2A-2, H2A-3, H2A-4, H2A-5, H2A-8, H2B-1, H2B-4, H2B-5, H2B-6, and H2B-7, is 3 that is the same as the number of the first through-holes located between the second-second through-holes H2A-6, H2A-7, H2B-2, and H2B-3. However, unlike the illustration of FIG. 1, the number of the first through-holes, located between the second-first through-holes H2A-1, H2A-2, H2A-3, H2A-4, H2A-5, H2A-8, H2B-1, H2B-4, H2B-5, H2B-6, and H2B-7, may be greater than the number of the first through-holes located between the second-second through-holes H2A-6, H2A-7, H2B-2, and H2B-3. As the number of the first through-holes increases, the contact area between the insulation layer 150 and the transmissive conductive layer 160 (or the second conductive semiconductor layer 126 when the transmissive conductive layer 160 is omitted) increases. Thus, the coupling force between the insulation layer 150 and the transmissive conductive layer 160 (or the second conductive semiconductor layer 126 when the transmissive conductive layer 160 is omitted) becomes greater at the edge than that at the center of the light emitting structure 120. Hence, even if the reflective layer 130 has lower adhesion and suffers from more frequent metal peeling at the edge of the light emitting structure 120 than the center of the light emitting structure 120, it is possible to strengthen the low adhesion and thus prevent the metal peeling phenomenon.

In addition, when the first widths W1 (e.g., W11 to W20) of the at least one first through-holes H1 in the second direction (e.g., in the x-axis), which is different from the first direction (e.g., in the z-axis), are below 5 μm, the adhesion between the insulation layer 150 embedded in the first through-holes H1 and the transmissive conductive layer 160 (or the second conductive semiconductor layer 126 when the transmissive conductive layer 160 is omitted) may not be great. Alternatively, when the first widths W1 (e.g., W11 to W20) are above 30 μm, the amount of carrier, injected into the second conductive semiconductor layer 126 by way of the reflective layer 130 from the second pad 174, may be reduced, resulting in deterioration in light emission efficiency. Accordingly, the first widths W1 (e.g., W11 to W20) may be within a range from 5 μm to 30 μm, although the embodiment is not limited thereto.

In addition, when the sum of the first widths W1 of the respective first through-holes H1 (e.g., H1-1 to H1-10) is greater than 30% of the total width WT of the reflective layer 130 in the second direction (e.g., in the x-axis), the amount of carrier, injected into the second conductive semiconductor layer 126 by way of the reflective layer 130 from the second pad 174, may be reduced, resulting in deterioration in light emission efficiency. Accordingly, the sum of the first widths W1 may be 30% or less of the total width WT of the reflective layer 130, although the embodiment is not limited thereto.

Figure 9:
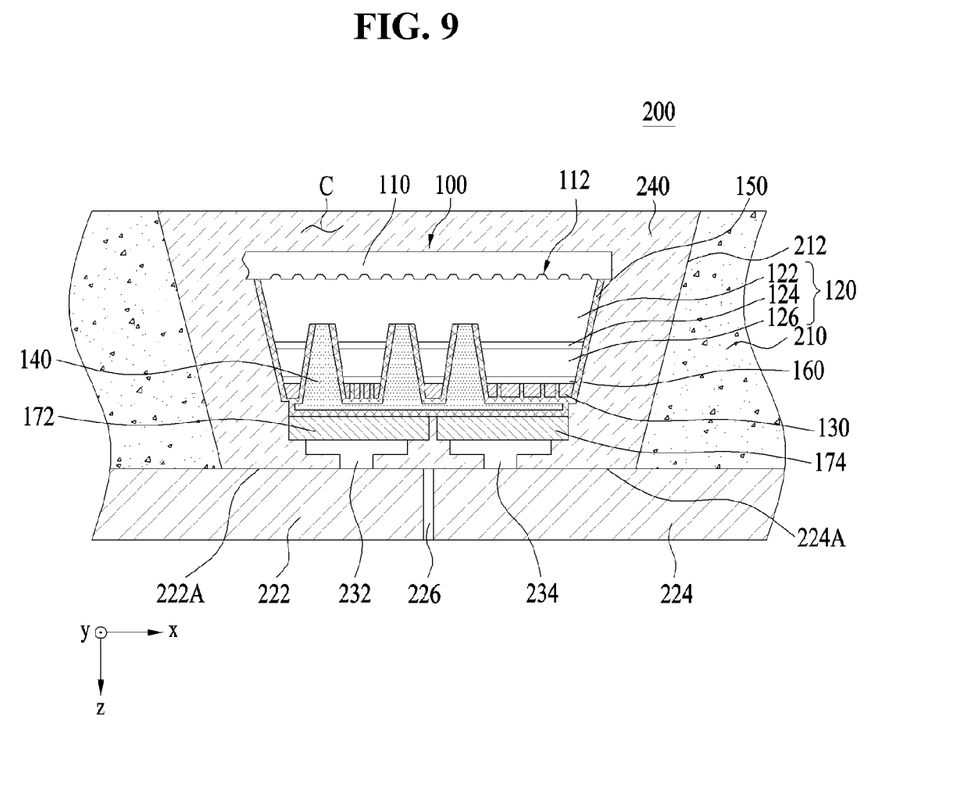
FIG. 9 is a sectional view of a light emitting device package according to an embodiment.

FIG. 9 is a sectional view of a light emitting device package 200 according to an embodiment.

The light emitting device package 200 illustrated in FIG. 9 may include the light emitting device 100, a package body 210, first and second lead frames 222 and 224, an insulator 226, first and second solders 232 and 234, and a molding member 240.

The package body 210 may define a cavity C. For example, as exemplarily illustrated in FIG. 9, the package body 210 may define the cavity C along with the first and second lead frames 222 and 224. That is, the cavity C may be defined by a side surface 212 of the package body 210 and upper surfaces 222A and 224A of the first and second lead frames 222 and 224. However, the embodiment is not limited thereto, and in another embodiment, the cavity C may be defined only by the package body 210, unlike the illustration of FIG. 9. Alternatively, a barrier wall (not illustrated) may be disposed on the flat upper surface of the package body 210, and the cavity may be defined by the barrier wall and the upper surface of the package body 210. Although the package body 210 may be formed of, for example, an Epoxy Molding Compound (EMC), the embodiment is not limited to the material of the package body 210.

The first and second lead frames 222 and 224 may be spaced apart from each other in the second direction (e.g., in the x-axis) which is perpendicular to the first direction (e.g., in the z-axis) corresponding to the thickness direction of the light emitting structure 120. Each of the first and second lead frames 222 and 224 may be formed of a conductive material, for example, a metal, and the embodiment is not limited to the kinds of materials of the respective first and second lead frames 222 and 224. The insulator 226 may be located between the first and second lead frames 222 and 224, in order to electrically isolate the first and second lead frames 222 and 224 from each other.

In addition, when the package body 210 is formed of a conductive material, for example, a metal material, the first and second lead frames 222 and 224 may constitute a portion of the package body 210. In this case, the first and second lead frames 222 and 224 of the package body 210 may be electrically isolated from each other by the insulator 226.

The first solder 232 electrically connects the first lead frame 222 to the first conductive semiconductor layer 122 via the first pad 172. To this end, the first solder 232 may be located between the first lead frame 222 and the first pad 172 so as to electrically connect the two 222 and 172 to each other. The second solder 234 electrically connects the second lead frame 224 to the second conductive semiconductor layer 126 via the second pad 174. To this end, the second solder 234 may be located between the second lead frame 224 and the second pad 174 so as to electrically connect the two 224 and 174 to each other. Each of the first and second solders 232 and 234 may be solder paste or solder balls.

As described above, the first and second solders 232 and 234 may eliminate the necessity of wires by electrically connecting the first and second conductive semiconductor layers 122 and 126 to the first and second lead frames 222 and 224 respectively. However, according to another embodiment, the first and second conductive semiconductor layers 122 and 126 may be connected respectively to the first and second lead frames 222 and 224 using wires.

The light emitting device 100 may be placed inside the cavity C and correspond to the light emitting device 100 illustrated in FIGS. 1 to 6. Thus, the light emitting device will be described below using the same reference numerals and the same configuration is not repeatedly described.

In addition, the molding member 240 may fill the cavity C to enclose and protect the light emitting device 100. The molding member 240 may be formed of, for example, silicon (Si) and contain phosphors, thus being capable of changing the wavelength of light emitted from the light emitting device 100. Although the phosphors may include phosphors selected from among YAG-based, TAG-based, silicate-based, sulfide-based, and nitride-based wavelength change materials which may change light generated from the light emitting device 100 into white light, the embodiment is not limited to the kinds of phosphors.

The YGA-based and TAG-based phosphors may be selected from among (Y, Tb, Lu, Sc, La, Gd, Sm) 3 (Al, Ga, In, Si, Fe) 5 (O, S) 12:Ce, and the silicate-based phosphors may be selected from among (Sr, Ba, Ca, Mg) $2SiO_4$:(Eu, F, Cl)

In addition, the sulfide-based phosphors may be selected from among (Ca, Sr) S:Eu, (Sr, Ca, Ba) (Al, Ga) 2S4:Eu, and the nitride-based phosphors may be selected from among (Sr, Ca, Si, Al, O) N:Eu (e.g., $CaAlSiN_4$:Eu β-SiAlON:Eu) or Ca-α SiAlON:Eu-based (Cax, My) (Si, Al) 12 (O, N) 16 (here, M is at least one of Eu, Tb, Yb or Er, $0.05<(x+y)<0.3$, $0.02<x<0.27$, and $0.03<y<0.3$, which may be the selected phosphor).

Red phosphors may be nitride-based phosphors including N(e.g., $CaAlSiN_3$:Eu). The nitride-based red phosphors have higher reliability in resistance to external environments such as, for example, heat and moisture and lower discoloration risk than sulfide-based phosphors.

In the case of the light emitting device 100 and the light emitting device package 200 according to the embodiment, the at least one first through-hole H1 is formed in the reflective layer 130 and the insulation layer 150 is embedded in the first through-hole H1. Thereby, as described above, weak adhesion between the reflective layer 130 and the transmissive conductive layer 160 (or the second conductive semiconductor layer 126 when the transmissive conductive layer 160 is omitted) may be strengthened. In addition, as the insulation layer 150 is embedded in the first through-hole H1, thermal stress at the transmissive conductive layer 160 (or the second conductive semiconductor layer 126) upon flip-chip bonding may be released, resulting in improved reliability.

An array of a plurality of light emitting device packages 200 according to the embodiment may be disposed on a board, and optical members such as, for example, a light guide plate, a prism sheet, and a diffuser sheet may be disposed in an optical path of the light emitting device packages 200. The light emitting device packages 200, the board, and the optical members may function as a backlight unit.

In addition, the light emitting device package 200 according to the embodiment may be applied to a light emitting apparatus such as, for example, a display apparatus, an indicator apparatus, and a lighting apparatus.

Here, the display apparatus may include a bottom cover, a reflective plate disposed on the bottom cover, a light emitting module configured to emit light, a light guide plate disposed in front of the reflective plate to forwardly guide light emitted from the light emitting module, optical sheets including prism sheets disposed in front of the light guide plate, a display panel disposed in front of the optical sheets, an image signal output circuit connected to the display panel to supply an image signal to the display panel, and a color filter disposed in front of the display panel. Here, the bottom cover, the reflective plate, the light emitting module, the light guide plate, and the optical sheets may constitute a backlight unit.

In addition, the lighting apparatus may include a light source module which includes a board and the light emitting device package 200 according to the embodiment, a radiator configured to radiate heat of the light source module, and a power supply unit configured to process or convert an electrical signal from an external source so as to supply the same to the light source module. For example, the lighting apparatus may include a lamp, a headlamp, or a streetlight.

The headlamp may include a light emitting module which includes the light emitting device packages 200 arranged on a board, a reflector configured to reflect light, emitted from the light source module, in a given direction, for example, forwardly, a lens configured to forwardly refract light reflected by the reflector, and a shade configured to achieve a light distribution pattern selected by a designer by blocking or reflecting some of light, reflected by the reflector and directed to the lens.

As is apparent from the above description, in a light emitting device and a light emitting device package according to the embodiment, since an insulation layer is embedded in at least one first through-hole formed in a reflective layer and is adhered to a transmissive conductive layer (or a second conductive semiconductor layer), it is possible to strengthen insufficient adhesion between the reflective layer and the transmissive conductive layer (or the second conductive semiconductor layer) and to eliminate thermal stress at the transmissive conductive layer (or the second conductive semiconductor layer) upon flip-chip bonding, which may result in improved reliability.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a substrate;
   a light emitting structure disposed under the substrate, the light emitting structure including a first conductive semiconductor layer, an active layer, and a second conductive semiconductor layer;
   a reflective layer disposed under the second conductive semiconductor layer, wherein at least one first through-hole penetrates the reflective layer in a first direction, the first direction being a thickness direction of the light emitting structure;

a contact layer embedded in at least one second through-hole penetrating the reflective layer, the second conductive semiconductor layer, and the active layer, so as to be connected to the first conductive semiconductor layer; and an insulation layer disposed between the contact layer and each of the reflective layer, the second conductive semiconductor layer, and the active layer, wherein the at least one first through-hole is filled with the insulation layer so as to be directly adhered to the second conductive semiconductor layer, wherein the at least one first through-hole includes a plurality of first through-holes, wherein the at least one second through-hole includes a plurality of second through-holes, wherein at least one of the plurality of first through-holes is located between multiple second through-holes, wherein the plurality of second through-holes includes:
 a plurality of second-first through-holes located closer to an edge than to a center of the light emitting structure; and
 a plurality of second-second through-holes located closer to the center than to the edge of the light emitting structure, wherein the number of the plurality of first through-holes is greater between the second-first through-holes than that between the second-second through-holes, wherein each first through-hole is spaced apart from one another by the same distance or different distances, and wherein each first through-hole has a first width in a second direction, the second direction being different from the first direction, and the first width increases with decreasing distance to an edge of the reflective layer.

2. The device according to claim 1, wherein each first through-hole exposes the second conductive semiconductor layer, and the insulation layer comprises an insulation material having greater adhesion to the second conductive semiconductor layer than adhesion of the reflective layer to the second conductive semiconductor layer.

3. The device according to claim 1, wherein the first width is less than a second width of each second through-hole in the second direction.

4. The device according to claim 1, wherein the sum of first widths of the respective first through-holes in a second direction is 30% or less of the total width of the reflective layer in the second direction, the second direction being different from the first direction.

5. The device according to claim 1, wherein the insulation layer includes a distributed bragg reflector or omni-directional reflector layer.

6. The device according to claim 1, wherein the first width is within a range from 5 µm to 30 µm.

7. The device according to claim 1, further comprising a transmissive conductive layer disposed between the second conductive semiconductor layer and the reflective layer,
 wherein each first through-hole exposes the transmissive conductive layer, and the insulation layer comprises an insulation material having greater adhesion to the transmissive conductive layer than adhesion of the reflective layer to the transmissive conductive layer.

8. The device according to claim 1, further comprising:
 a first pad disposed under the contact layer, the first pad being connected to the first conductive semiconductor layer via the contact layer; and
 a second pad penetrating the insulation layer so as to be connected to the reflective layer.

9. The device according to claim 8, wherein the insulation layer extends in a second direction so as to be disposed between each of the first and second pads and the contact layer, the second direction being different from the first direction.

10. The device according to claim 8, wherein each first through-hole is located above at least one of the first pad or the second pad.

11. A light emitting device package comprising:
 the light emitting device according to claim 1;
 a first solder configured to be electrically connected to the first conductive semiconductor layer of the light emitting device;
 a second solder configured to be electrically connected to the second conductive semiconductor layer of the light emitting device;
 first and second lead frames spaced apart from each other in a second direction, the second direction being different from the first direction; and
 a molding member configured to enclose and protect the light emitting device.

12. A lighting apparatus including the light emitting device package according to claim 11.

* * * * *